United States Patent [19]

Gunsagar et al.

[11] 3,983,413
[45] Sept. 28, 1976

[54] BALANCED DIFFERENTIAL CAPACITIVELY DECOUPLED CHARGE SENSOR

[75] Inventors: Kamleshwar C. Gunsagar, Campbell; John P. Guadagna, San Jose, both of Calif.

[73] Assignee: Fairchild Camera and Instrument Corporation, Mountain View, Calif.

[22] Filed: May 2, 1975

[21] Appl. No.: 574,185

[52] U.S. Cl. .................. 307/235 F; 307/221 D; 307/235 H; 307/DIG. 3
[51] Int. Cl.² ................. H03K 5/20; H01L 29/78; G11C 19/28
[58] Field of Search ........ 307/221 C, 221 D, 235 F, 307/235 T, 238, 279, 304; 340/173 CA

[56] References Cited
UNITED STATES PATENTS

| | | | |
|---|---|---|---|
| 3,514,765 | 5/1970 | Christensen | 307/DIG. 3 |
| 3,678,473 | 7/1972 | Wahlstrom | 340/173 CA |
| 3,758,794 | 9/1973 | Kosonocky | 307/304 |
| 3,760,381 | 9/1973 | Yao | 307/238 X |
| 3,774,176 | 11/1973 | Stein et al. | 307/238 X |
| 3,838,295 | 9/1974 | Lindell | 340/173 CA X |
| 3,838,404 | 9/1974 | Heeren | 307/DIG. 3 |
| 3,882,326 | 5/1975 | Kruggel | 340/173 CA |
| 3,892,984 | 7/1975 | Stein | 307/238 X |

OTHER PUBLICATIONS

Lohrey, "Monolithic Associative Memory Using Read/Write Array"; *IBM Tech. Discl. Bull.*; vol. 14, No. 6, pp. 1698–1699; 11/1971.

*Primary Examiner*—John S. Heyman
*Assistant Examiner*—L. N. Anagnos
*Attorney, Agent, or Firm*—Alan H. MacPherson; Henry K. Woodward; J. Ronald Richbourg

[57] ABSTRACT

A balanced differential capacitively decoupled charge sensor for detecting small amounts of charge comprises balanced differential sensing means adapted to receive charge representing data and charge representing a reference value, a pair of capacitance decoupling transistors, the respective drains of each of said pair of capacitance decoupling transistors being electrically coupled to the respective inputs of said differential sensing means, a matched pair of charge output nodes electrically coupled to the respective sources of said capacitance decoupling transistors and adapted to receive, respectively, data charge and reference charge, and means for biasing and resetting both of said charge output nodes so that said capacitance decoupling transistors are functioning in a high transconductance mode when data charge and reference charge are received.

8 Claims, 2 Drawing Figures

BALANCED DIFFERENTIAL CAPACITIVELY DECOUPLED CHARGE SENSOR

BACKGROUND OF THE INVENTION

This invention relates to a scheme for sensing small amounts of charge and more particularly relates to a balanced differential charge sensor with sense nodes capacitively decoupled from the output nodes of charge storage elements and means for biasing and resetting the output nodes.

The advent of charge-transfer systems as means of accomplishing data storage and retrieval has established the need to detect accurately relatively small amounts of charge. Bucket-brigade devices, charge-coupled deviced (CCD's) and similar devices are capable of storing and transferring charge with magnitudes smaller than $50 \times 10^{-15}$ coulombs. Traditional techniques such as floating gate amplifiers or gated charge integrators are not totally suitable for measuring such small charges or for discriminating between small charges, particularly if the sense node capacitance is large. The use of a gate to decouple the incoming charge from a high-capacitance distribution line from a sense node is disclosed in Engler et al, "A Surface-Charge Random-Access Memory System", J.SSC, SC-7, No. 5, pp. 330 et seq., and in Heller et al, "High-Sensitivity Charge-Transfer Sense Amplifier", Digest, ISSCC, Feb. 13, 1975, pp. 112 et seq. At high data rates this technique has been found to be subject to "pattern sensitivity", i.e., the detected charge will vary as a function of the history of the information signal. Such pattern sensitivity is intolerable in a device which must be capable of operating with any conceivable information sequence which may be stored therein and retrieved therefrom.

An underlying problem which prior sensing schemes encountered in transferring small amounts of charge when output node capacitances were large was that a small amount of charge would not produce sufficient transconductance during transfer to allow the charge to be completely transferred in a reasonable amount of time. A technique to circumvent the slow response of a large capacitance to a small charge transfer is to precharge or bias the output node. If the precharge is suitably achieved, then even a small signal charge will be transferred quickly. See U.S. Pat. No. 3,764,906 issued to Heller and entitled "Stored Charge Detection by Charge Transfer." The precharge must be carefully generated, thereby necessitating considerably support circuitry.

Another problem in measuring small amounts of charge is that the measurement means must be able to discriminate between small charges whose actual magnitude may vary as a result, for example, of processing variations or changes in operating conditons such as temperature, etc. Also, the sensitivity of the measurement means must be high enough and must track process and operating conditions so that accurate measurement can be made over the range of expected charge magnitudes. This requirement inherently increases the number of components and complexity of the measurement means. A technique that is used to moderate this problem is to utilize a balanced measurement means. This has the effect of reducing changes in the absolute value of device parameters to only the effective differences between compared quantities with these differences being small for matched devices. See, for example, copending application Ser. No. 492,649 for "Dynamic Reference Voltage Generator" assigned to the same assignee as this application, and U.S. Pat. No. 3,760,391 issued to Y. L. Yao for "Stored Charge Memory Detection Circuit." Such schemes generally require particularized and therefore complex circuit architecture that can limit the range of applications.

SUMMARY OF THE INVENTION

A balanced differential capacitively decoupled charge sensor for detecting small amounts of charge comprises a balanced differential sensing means adapted to receive data charge and reference charge, the balanced differential sensing means determining the logic state represented by the data charge, a pair of capacitance decoupling transistors, the respective drains of each of the pair of capacitance decoupling transistors being electrically coupled to the respective inputs of the differential sensing means, a match pair of charge output nodes electrically coupled to the respective sources of the capacitance decoupling transistors and adapted to receive, respectively, data charge and reference charge, and means for biasing and resetting both of the charge output nodes so that the capacitance decoupling transistors are functioning in a high transconductance mode when data charge and reference charge are received.

In a preferred embodiment, a dedicated line of reference charge storage elements is electrically coupled to one of the charge output nodes to provide a reference charge and at least one line of data charge storage elements is electrically coupled to the other charge output node to provide data charge.

BRIEF DESCRIPTION OF THE DRAWINGS

For a more complete understanding of the balanced differential capacitively decoupled charge sensor of the present invention, reference may be had to the accompanying drawings which are incorporated herein by reference and in which.

DESCRIPTION OF THE PREFERRED EMBODIMENT

The utilization of charge storage and transfer in memory applications often results in multiple lines of charge transfer elements being tied to a single output node as in a charge-coupled device or multiple charge storage elements connected to a single output node such as a bit line in a single transistor cell random access memory. Whether the charge transfer mechanism is bucket-brigade, charge-coupled device or some other charge-biased scheme, a basic design decision must be made in terms of providing each line with output buffer circuitry or typing a number of lines or elements to a single output node. The first approach adds to device size, complexity and cost. The latter approach results in a relatively high capacitance node on which signal charge is transferred, resulting in a small voltage change.

The charge sensor of the present invention combines a balanced differential comparator with a means to transfer charge from a large capacitance output node to the small-capacitance sensing node of the comparator at high data rates. High data rates are possible because means is provided to bias the output nodes so that decoupling transistors transfer charge in a high transconductance mode. The balance feature of the differential comparator and bias circuitry also permits wide operating margins by reducing process and temperature dependence of the circuit to device-matching characteristics. Also, a reference charge is provided which varies in amplitude in accordance with variations in amplitude of a full data charge, further reducing sensitivity to processing.

Figure 1:
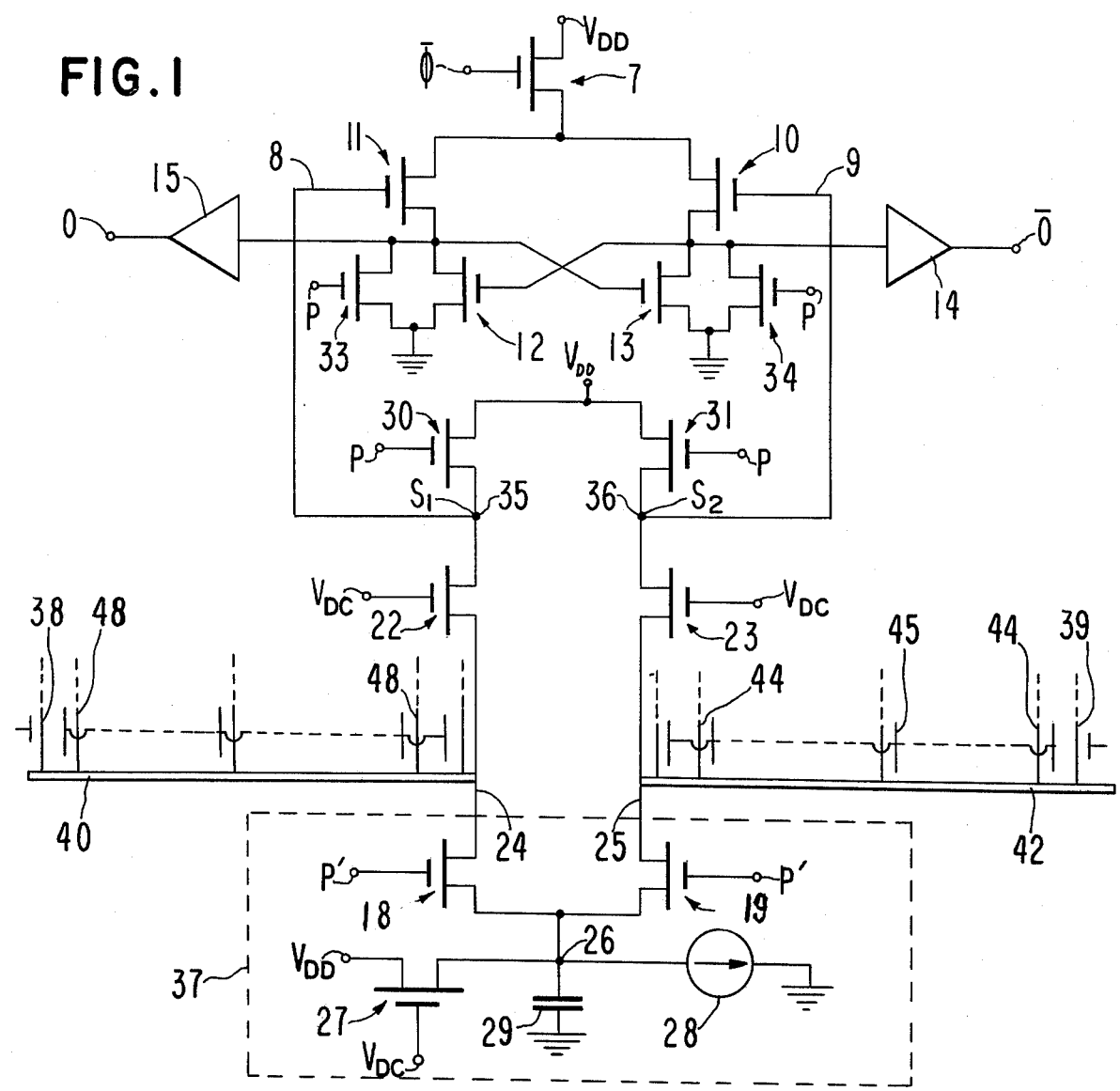
FIG. 1 is a schematic diagram of a balanced differential sensing means electrically coupled to respective output nodes of a line of data charge storage elements and a dedicated line of reference charge storage elements through a pair of decoupling transistors with both output nodes being coupled to a means for biasing and resetting.

In FIG. 1, a working embodiment specifically designed for use in a line-addressable random-access memory is depicted. Charge output nodes are tied to a plurality of lines of data charge storage elements, e.g., lines 48 and 44, and to a single dedicated line of reference charge storage elements, e.g., lines 38 and 39. The respective capacitances of output nodes 40 and 42 will typically be high relative to the capacitances of the charge storage elements which make up the individual charge transfer lines which are tied to them due to the relative physical dimensions. Even if the layout is optimized, the capacitance of output node 40 will be large when compared with individual data or signal charge received by it, especially if minimum cell size is achieved for the charge storage elements. Thus, a charge sensor is required which can detect small charges which appear on output nodes or transfer lines which have high capacitances.

The companion output nodes 40 and 42 are coupled through decoupling transistors 22 and 23 to the sense nodes $S_1$ and $S_2$ of the balanced differential sensing means. In the embodiment shown, at any given time, one output node will be set up to receive or will be receiving a reference charge, while the other node will be set up to receive or will be receiving data charge. When output node 40 is functioning as the data charge node, data charge will be received from a particular one of the lines 48 and output node 42 will receive a reference charge from dedicated reference line 39. The charge which is transferred to sense node 35 through decoupling transistor 22 thus represents data, while the charge which is transferred to sense node 36 through decoupling transistor 23 constitutes the reference charge. The introduction of dta charge and reference charge on line 8 and 9 to the gates of transistors 11 and 10, and the operation of the differential sensing means, are described subsequently.

In accordance with the present invention, prior to the receipt of either the data or reference charge, the output nodes 40 and 42 are biased by a bias means encompassed within dotted line 37. This bias ensures that the sources of decoupling transistors 22 and 23 are at a low enough voltage so the transistors operate in a high transconductance mode. Since the decoupling transistors are operating in the high transconductance mode, wen data charge is received on one output node 40 or 42 and reference charge on the other, the data charge passes through the appropriate decoupling transistor and onto one of the input gates of the differential charge sensing means faster than it would without controlled bias on the charge output nodes; the reference charge similarly passes through to the other decoupling transistor. For high-frequency operation it has been found desirable to lower the impedance of the decoupling transistors in this manner so that the speed of transfer of small charges from memory storage sites to a sensing means is enhanced.

Bias and resetting means 37 constitutes a voltage source set up by current. Constant current source 28 produces a current which flows from $V_{DD}$ through field-effect transistor 27 and node 26 to ground. When the clock P goes high, output nodes 40 and 42 are reset to a precise voltage determined by transistors 27, 22 and 23. Also, transistors 18 and 19 turn on when clock P' goes high and allow current to flow through lines 24 and 25. To allow for transitional current (and for the collateral transitional current when clock P goes low) without extreme fluctuation in voltage on node 26, capacitor 29 is provided between node 26 and ground; node 26 acts as a voltage and charge source set by the gate-to-source voltage of field-effect transistor 27. The result is that the current which flows through decoupling transistors 22 and 23 places them in a high transconductance mode. The actual current through the decoupling transistors 22 and 23 will depend on the ratio of the device sizes of transistors 22 or 23 and 27 (decoupling transistor 22 is designed, in the preferred embodiment, to be equal in size to decoupling transistor 23). Since these device sizes can be carefully proportioned, the current through decoupling transistors 22 and 23 can be carefully controlled and thus the preferred equally high transconductance characteristics can be precisely obtained. The absolute magnitude of the current may vary over a wide range depending upon device sizes, charge size and required speed.

Just prior to receipt of the data and reference charges, the sensing nodes were preset in voltage by P through transistors 30 and 31. P must turn transistors 30 and 31 off to allow nodes 35 and 36 to integrate the bias curent in conductors 24 and 25 and accept the transferred charges for sensing. Also, the bias current could be turned off by signal P' on transistors 18 and 19 since accummulated bias current at the sensing nodes could exceed the common mode rejection range of the differential sensing means. When a data charge appears on either output node 40 or 42 and a reference charge on the other, they will pass through the respective decoupling transistor 22 or 23, to sense node 35 or 36. The data charge and accumulated bias charge will then repose on the gate electrode of either field-effect transistor 11 or 10 of the charge sensing means, but since the accumulated bias charge is balanced the sensing means' common mode rejection only allows the difference between the signal charge and the reference charge to be detected.

Figure 2:
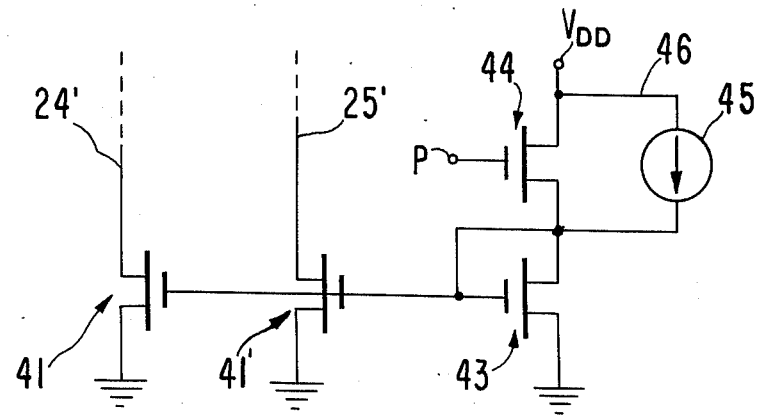
FIG. 2 is a schematic diagram of an alternative balanced resettable bias means for the balanced differential sensing means of FIG. 1.

An alternative embodiment of the bias means is shown in FIG. 2. The lines 24' and 25' correspond, respectively, to the lines 24 and 25 which are tied in FIG. 1 to output nodes 40 and 42. This bias means constitutes a pulsed current source. In operation, when P is high a balanced high current reset for the output nodes 40 and 42 is provided through transistors 41 and 41', resetting nodes 40 and 42 independently to voltages corresponding to the respective matched current levels in transistors 22 and 23. With this balanced pulsed current reset, an additional advantage is provided, i.e., the current balance in lines 24 and 25 is no longer dependent upon the respective threshold voltages of transistors 22 and 23. Prior to the receipt of charge, clock P goes low, allowing the current in transistors 41, 41' and 43 to decay to some lower value determined by curent source 45. Other bias means could achieve the same effect. It is essential to the operation of the charge sensing means, as described below, that the data charge and reference charge produce potentials on the gate electrodes of field-effect transistors 11 or 10 that represent, respectively, the binary logic state and a value approximately midway between the potential for one binary logic state and the potential for the other binary logic state. Thus, especially since the data charge will be small, the high level due to the bias current must be cancelled out. This is accomplished by the inherent symmetry of the balanced comparator in a manner akin to common mode rejection. The decoupling transistors 22 and 23 both transmit the bias current so that the potentials of gate electrodes 11 and 10 are equal except for the potential difference produced by the charge differential between the data charge and the reference charge or by any mismatch between decoupling transistors 22 and 23.

The operation of the differential comparator including the need for a reference signal is discussed in copending patent application Ser. No. 448,771 by K. Gunsagar entitled "Charge Sensing Arrangement" and assigned to the assignee of this invention. Briefly, the voltages on the gates of transistors 11 and 10 will determine their relative transconductance. If, for example, the data charge is introduced on line 8 to the gate of transistor 11 and the reference charge (approximately one-half the value of a full data charge) is introduced on line 9 to the gate of transistor 10, then transistor 10 will be more conductive than transistor 11 if a small charge signifying one binary logic state is received, whereas transistor 10 will be less conductive than transistor 11 if a full charge signifying another binary logic state is received. In the former case, transistor 12 will turn on before transistor 11, causing a high signal to be transmitted through amplifier 14, thereby signifying, in this example, the inverse output $\overline{0}$. In the latter case, transistor 13 will become conductive first, thereby setting up a high signal through amplifier 15 to signify the output 0. Cross-coupled transistors 12 and 13 are reset by transistors 33 and 34 and the input gates to load transistors 11 and 10 are reset by transistors 30 and 31 when the clock P again goes high.

In addition to the common mode rejection described above for cancelling out the effects of the bias current, it is necessary to ensure that the reference charge tracks the data charge. The comparator would give erroneous results even if bias current effects were eliminated if an improper reference charge were supplied to the differential comparator. It is necessary, then, that the reference charge be generated by a charge-generation mean which has undergone the same processing steps and experienced the same operating conditions as the data charge lines. In the balanced differential comparator of the present invention, the reference charge is produced in a dedicated line of reference charge storage elements which is tied to one of the output nodes 40 or 42. When the data charge is supplied by a particular one of data lines 48 to output node 40, the reference charge is supplied by dedicated reference line 39 to output node 42; similarly, when the data charge is supplied by a particular one of data lines 44 to output node 42, the reference charge is supplied by dedicated reference line 38 to output node 40. Several alternative embodiments exist for the dedicated line of reference charge storage elements. In one embodiment the charge storage elements in the dedicated line are fabricated with a charge storage capacity equal to one-half the capacity of the charge storage elements in the data lines. If the inputs to the dedicated line and the line of data charge storage elements are identical, then approximately one-half a full charge will be available as the reference charge and the charge-sensing means will operate properly. In an alternative embodiment, charge storage elements of equal capacity are provided for the dedicated line and for the lines of charge storage elements with the dedicated line receiving only half the input as the data lines. In another embodiment, the dedicated line is provided with a string of charge storage elements of equal width to those in the lines of data charge storage elements and with a device which splits the flow of charge into two channels prior to the connection with output nodes 40 or 42. If the channels are evenly split, then the reference charge provided to the charge sensing means will be approximately equal to one-half a full data charge. In a variation of this latter embodiment, the charge is divided at the beginning of the dedicated line and the remaining charge storage elements in the dedicated line are the same size as the charge storage elements in the lines of data charge storage elements. The shift rate and length of the dedicated line may be varied to produce a reference of suitable magnitude for the differential charge sensing means. The functional criterion is that the reference charge must produce a potential on the input to the differential charge sensing means which is essentially midway between the potential for one binary logic state and the potential for the other binary logic state.

The timing of the clocking pulses of the embodiment of FIG. 1 is self-evident. The clocking pulses P and P' must go low just before the clocking pulse $\phi$ goes high so that charge is applied to the balanced differential sensing means just before it begins to undertake a sensing operation. Preferably, the clock pulse P (which drives the data and reference line) goes low just prior to the clock pulse P' so that the bias is present on output nodes 40 and 42 when charge is actually received, i.e., in order to compensate for the finite transfer time from line to node. For resetting, $\overline{\phi}$ will go low before P and P' again goes high. In one embodiment a single clock pulse P is used to drive the data and reference lines and all clocked field-effect transistors except for transistor 7 which is clocked by $\overline{\phi}$.

What is claimed is:
1. A balanced differential capacitively decoupled charge sensor for detecting small amounts of charge, comprising:
   balanced differential sensing means adapted to receive charge representing data and charge representing a reference value, said differential sensing means comparing said data charge and said reference charge to determine the logic state represented by said charge representing data;
   a pair of capacitance decoupling transistors, the respective drains of each of said pair of capacitance decoupling transistors being electrically coupled to the respective inputs of said differential sensing means;
   a matched pair of charge output nodes electrically coupled to the respective sources of said capacitance decoupling transistors and adapted to receive, respectively, data charge and reference charge; and charging means for biasing and resetting both of said charge output nodes so that said capacitance decoupling transistors are functioning in a high transconductance mode when data charge and reference charge are received.

2. The balanced differential capacitively decoupled charge sensor as recited in claim 1, further comprising:
a dedicated line of reference charge storage elements electrically coupled to one of said charge output nodes; and
at least one line of data charge storage elements electrically coupled to the other of said charge output nodes.

3. The balanced differential capacitively decoupled charge sensor as recited in claim 2 wherein said dedicated line of reference charge storage elements and said at least one line of data charge storage elements consist of lines of charge-coupled elements fabricated in a semiconductor substrate.

4. The balanced differential capacitively decoupled charge sensor as recited in claim 3 wherein said dedicated line of reference charge storage elements contains charge storage elements of equal charge storage capacity to the charge storage elements in said line of data charge storage elements, said dedicated line having a number of charge storage elements equal to the number of charge storage elements in said data line.

5. The balanced differential capacitively decoupled charge sensor of claim 3 wherein said means for biasing comprises:
a pair of gating field-effect transistors, each of said transistors having its drain electrically coupled to a respective one of said output nodes, the sources of said transistors being connected to a common node;
a constant current source electrically coupled to said common node;
a capacitor connected between said common node and ground; and
a field-effect transistor whose source and drain are connected, respectively, to a high circuit potential and to said common node.

6. The balanced differential capacitively decoupled charge sensor of claim 5 wherein the gate electrodes of said gating transistors are connected to a clocking pulse which turns said gating transistors on to bias said output nodes and which turns said gating transistors off prior to receipt of data charge and reference charge by said charge output nodes.

7. The balanced differential capacitively decoupled charge sensor of claim 6 in combination with means for resetting said respective inputs of said differential sensing means prior to receipt of said charge representing data and said charge representing a reference value.

8. The balanced differential charge sensor of claim 3 wherein said means for biasing comprises:
a pair of gating field-effect transistors, each of said transistors having its drain electrically coupled to a respective one of said output nodes, the sources of said transistors being connected to ground, the gates of said gating field-effect transistors being connected to a common node;
a first field-effect transistor having its source and gate coupled to said common node and its drain coupled to ground;
a second field-effect transistor having its source connected to a high circuit potential, its drain coupled to said common node and its gate connected to a timing clock; and
a constant current source connected between said source of said second field-effect transistor and said common node.

* * * * *